United States Patent [19]

Howell et al.

[11] 4,220,913
[45] Sep. 2, 1980

[54] APPARATUS FOR AND METHODS OF ELECTROMAGNETIC SURVEYING OF ELONGATED UNDERGROUND CONDUCTORS

[75] Inventors: Mark I. Howell, Clifton; Lloyd H. Sole, Henleaze, both of England

[73] Assignee: Electrolocation Limited, Bristol, England

[21] Appl. No.: 908,855

[22] Filed: May 23, 1978

[51] Int. Cl.$^2$ .................. G01R 31/08; G01V 3/08
[52] U.S. Cl. ........................... 324/52; 324/326
[58] Field of Search .................. 324/3, 67, 52, 54

[56] References Cited

U.S. PATENT DOCUMENTS

| | | | |
|---|---|---|---|
| 3,526,831 | 9/1970 | Smith | 324/3 X |
| 3,562,633 | 2/1971 | Swain | 324/3 X |
| 3,617,865 | 11/1971 | Hakata | 324/3 |
| 3,893,025 | 7/1975 | Humphreys | 324/3 X |
| 3,907,136 | 9/1975 | Christides et al. | 324/67 |
| 4,085,360 | 4/1978 | Howell | 324/3 |
| 4,091,322 | 5/1978 | Stankoff | 324/67 X |

OTHER PUBLICATIONS

Young, C. A., Measuring the Depth of Buried Cable, Bell Laboratories Record, Nov. 1965, pp. 399–401.

*Primary Examiner*—Gerard R. Strecker
*Attorney, Agent, or Firm*—Young & Thompson

[57] ABSTRACT

Apparatus for detecting underground conductors carrying AC, such as cables or pipelines, has two receiver coils with horizontal axes one above the other, and other coils. By making phase comparisons from a selection of these the apparatus is located directly above the conductor. Then using the two horizontal coils there is derived a signal corresponding to the depth of the conductor, which can be visually indicated. Also, this depth signal, which is continuously available as the conductor is followed, is used to modify an output from one of the coils so that as the depth varies that output remains constant provided there are no discontinuities or faults in the cable.

11 Claims, 2 Drawing Figures

APPARATUS FOR AND METHODS OF ELECTROMAGNETIC SURVEYING OF ELONGATED UNDERGROUND CONDUCTORS

BACKGROUND OF THE INVENTION

This invention relates to apparatus for and methods of electromagnetic surveying. It is particularly, but not exclusively, concerned with surveying underground electrically conductive elements, and in this Specification it will be convenient to describe the invention in such terms, with the apparatus 'above' the element to be detected and, if not directly above some part of the element, then also to one 'side' of it.

The actual location of an underground cable or pipeline carrying AC by above ground coils is well known; and it has also been appreciated that a sudden change in coil response from one point to another may indicate a current leak or fault, for example in the wrapping of a pipeline. But such changes can also be attributable to rapid changes in depth, and much time, effort and expense can be wasted by digging down to a cable at such a point only to find that it is intact and merely deviates abruptly from the horizontal.

The detection of depth has also been achieved by the use of coils, and in U.S. Pat. No. 3,889,179 there is described a single coil portable apparatus that can be employed to trace a buried conductive element and also to determine its depth. But the two operations cannot be performed simultaneously. First the conductive element has to be located by a null response, and then the coil accurately re-oriented and moved laterally until a similar null response is attained. The depth is then determined by triangulation. It is difficult to hold the apparatus at an angle with great accuracy, the measurement of lateral movement requires tape measure and markers and is time consuming and troublesome, and accurate results will only be obtainable from a straight length of conductor.

OBJECTS AND SUMMARY OF THE INVENTION

It is therefore an object of this invention to provide a portable coil apparatus which locates underground conductors and simultaneously determines their depth. It should then use this depth information to make allowances for any change in depth which would otherwise affect the coil response. Detected changes can then be attributed to factors other than change of depth, such as leaks to earth.

According to the present invention there is provided apparatus for surveying an underground pipeline or other elongated element which carries, or can be made to carry, AC, the pipeline or element then forming a conductor around which there is a substantially cylindrical electromagnetic field, the apparatus comprising a coil array including a pair of axially parallel coils arrangeable, in use, one above the other, with their axes horizontal and transverse to the conductor; a phase comparator and indicator circuit for distinguishing from a selection of coils of said array on which side of the conductor the array lies, a depth correction circuit including means responsive to the first pair of coils to provide a correction factor dependent on the depth of the conductor, and a variable gain amplifier whose output is that of a coil of said array modified by the correction factor in such manner that variations in depth alone of the conductor leaves said output substantially unaffected, and indicator or recording means responsive to said variable gain amplifier output.

Generally, one of the first pair of coils provides the signal to be modified by the amplifier, while the coil array may also include a second pair of spaced coils with axes transverse to and generally coplanar with those of the first pair, and which in use have their axes generally vertical. One of this second pair can provide the signal to be modified by the amplifier. The phase comparator may be arranged to compare the phases of said second pair of coils to determine whether the coil array is registered with said conductor, and to compare the phases of one of the first pair of coils and one of the second pair to determine on which side of the conductor the coil array lies. It may then act as a gate to pass to the indicator one or other of the signals from the second pair of coils, depending on the phase relationship between said one coils of the first and second pairs. The indicator is conveniently of the moving needle type, the needle being centred when the coil array is directly over the conductor. Excursions to either side warn the operator when he is off course and show the direction to correct. This may be augmented by audible warning means; for example, sound is generated if the operator is off course.

The output of the variable gain amplifier may also be applied to a visual display in the form of a moving needle indicator. It may also be integrated and an alarm arranged to respond to variations greater than a predetermined amount in the integrated output.

The foregoing as well as other objects and features of the present invention will become more apparent upon consideration of the following detailed description when taken in conjunction with the drawings.

DETAILED DESCRIPTION OF THE ILLUSTRATED EMBODIMENT

Figure 1:
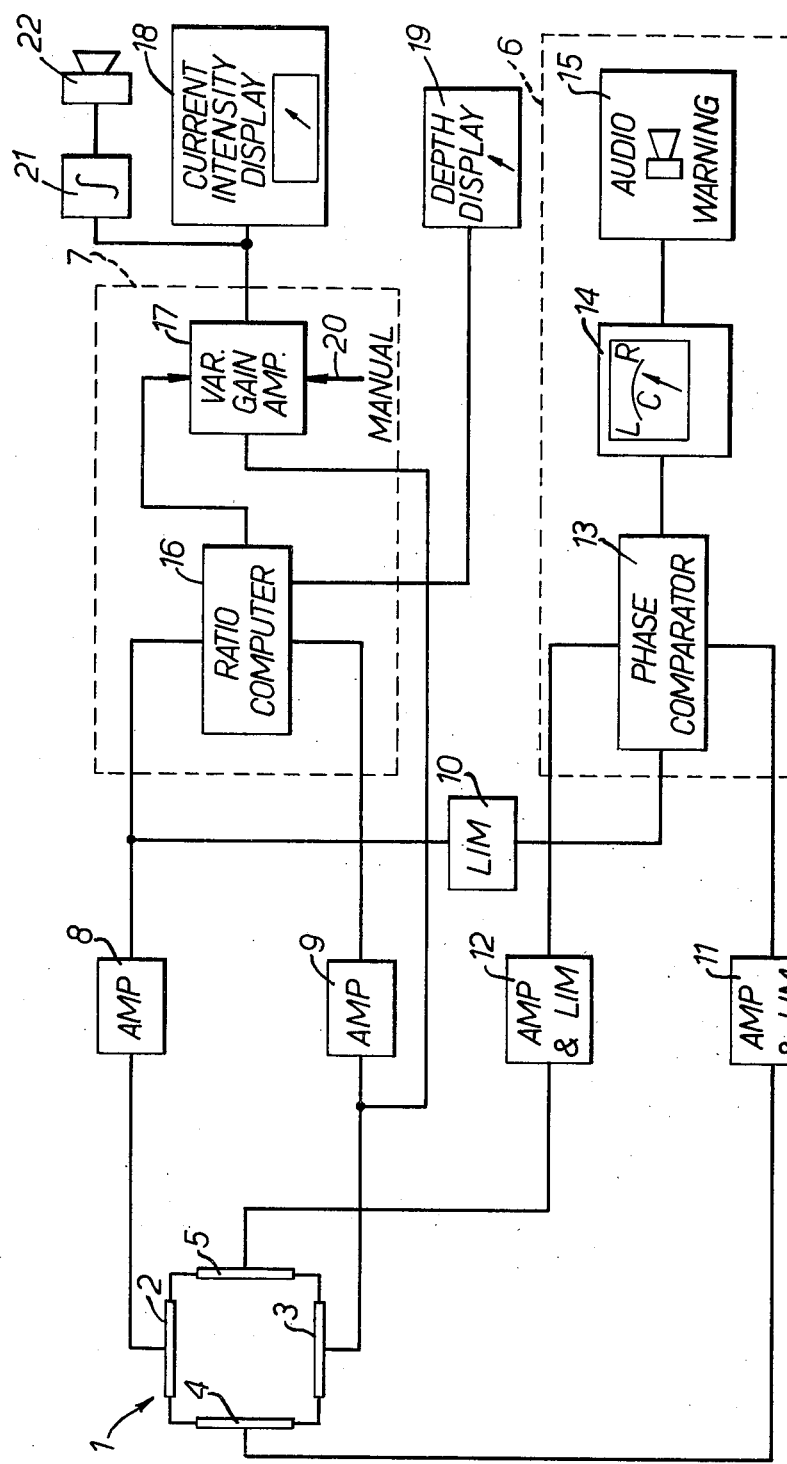
FIG. 1 is a circuit diagram of apparatus for electromagnetic surveying.

The apparatus comprises a coil array 1 which has a first pair of parallel coils 2,3 carried with their axes horizontal and a second pair of coils 4,5 at right angles to the first pair and with their axes carried vertically, the coplanar axes defining the sides of a square or rectangle. Preferably the coils are ferrite cored.

The outputs of these coils are used to determined from a phase comparator and indicator circuit 6 whether the coil array is correctly located above a buried conductor carrying AC, such as a metal pipeline P. They are also used to determine whether the electromagnetic field has any anomalies, making allowance for changes in depth in the pipeline P. This is ascertained from a depth correction circuit 7.

The signals from coils 2, 3 are respectively applied through amplifiers 8, 9 to the circuit 7, while that of coil 2 is also applied, after amplification, via limiter 10 to circuit 6. The signals from coils 4, 5 are fed to respective amplifiers and limiters 11, 12 and thence to circuit 6. In that circuit a phase comparator 13 compares the various phase relationships of coils 2, 4 and 5 and governs the operation of a moving needle indicator 14 in the form of a centre-zeroing meter and an audible alarm 15.

A generally cylindrical electromagnetic field is caused by AC in the pipeline P and this current may be applied by a signal generator G connected between the pipeline and earth. The frequency is preferably between 500 Hz and 10 KHz and the current in the range 10 to 2000 mA. The current, and hence the field, will generally decline linearly along the pipeline, for it is directly related to the electrical resistance of the metal, the capacitive effect of the surrounding soil divided by the diameter of the pipeline, and the thickness of the coating plus the conductivity of the surrounding soil. These will normally be constant along the pipeline. But variations in depth will noticeably vary the electromagnetic field detected at the surface of the ground, as will current leaks through the wrapping.

The horizontal and vertical components of the electromagnetic field are picked up by the coils. With the coils 4 and 5 having vertical axes straddling the pipeline their signals are out-of-phase. If the coils 4 and 5 move entirely to one side or the other of the pipeline they go in-phase and the comparator 13 will then cause the alarm 15 to sound, there being silence with the out-of-phase condition.

In order to distinguish to which side of the pipeline the coil array has strayed, comparison is made between the signals from one of the coils with a horizontal axis, coil 2, and from one of the coils with a vertical axis, say coil 5. As coil 5 passes from one side of the pipeline to the other the phase of its output will change in relation to that of coil 2, which will only vary in amplitude. Thus a phase comparison between these coils will give a 'left' or 'right' indication of the location of the coil array in relation to the pipeline, and this is used to switch the polarity of the centre-zeroing meter 14. An indication not only of the side but also of the extent of the deviation is given by this moving needle indicator 14. As the coils move away from the central position so for a short distance does the strength of the signals from the coils with vertical axes rise, and this can be reflected in the swing of the needle. The signal applied to the indicator is derived from whichever coil with a vertical axis is nearest the pipeline P, the phase comparator acting as a gate that switches on sensing a phase change, as described above, selectively to connect the output of circuit 11 or 12 to the indicator 14. Thus the needle will inform the operator on which side and by how much he has deviated from the pipeline.

The amplified outputs of coils 2 and 3 are applied to a ratio computer 16 in the depth correction circuit 7.

Assuming a source of electromagnetic radiation to have a horizontal axis and to be underground at depth d, if the axis of the receiving coil on the ground is also horizontal and, with the vertical, subtends an angle $\theta$ at the source and has its axis at an angle $\phi$ to the electromagnetic lines of force viewed in plan, then the signal strength at the receiving coil is proportional to $d^{-x} \cos \theta \cos \phi$. Index x depends on the type of source, but for an effectively infinite conductor creating a cylindrical field, $x = 1$, and it will be assumed that this is the type of conductor being detected. In use of this device $\phi$ will generally be zero and therefore $\cos \phi = 1$. But even if $\phi$ is a small angle, it will apply equally to both coils, and since a ratio is to be obtained it will cancel out.

Assuming the lower coil 3 is at distance $d_1$ from the source, and subtends an angle $\theta_1$, and the upper coil 2 is at distance $d_2$ and subtends an angle $\theta_2$, the responses from the two coils can be subtracted to obtain a combined response proportional to $1/d_1 \cos \theta_1 - 1/d_2 \cos \theta_2$.

If the coils are traversed across the source a sharply peaked trace would be obtained, the peak vertically coinciding with the source. When the coil array is vertically over the radiating source or service with the lower coil on the ground, $\theta_1 = \theta_2 = 0$ and the depth of the source equals $d_1$. One coil with a horizontal axis is disconnected, say the upper coil 2. The gain of an amplifier meter giving a readout is adjusted so that the meter reads a standard setting, say full scale deflection (FSD) and this represents $1/d_1$. The previously disconnected upper coil is reconnected in anti-phase, i.e. so that its output is subtracted from that of the other coil, and this will depress the amplifier meter reading by an amount proportional to $1/d_2$. Thus the meter reading is proportional to $1/d_1 - 1/d_2$, but as $(d_2 - d_1)$ is constant, the reading is directly related to $d_1$ alone, and the meter can be calibrated to give a direct read-out of $d_1$. Thus the output of the computer 16 will vary with the depth of the pipeline P and it can be used to give a direct depth reading at a meter 19.

The output of the lower coil 3 is also fed to a variable gain amplifier 17 whose gain is governed by the output of computer 16 in such manner that fluctuations is pipeline depth are allowed for and no apparent variation in signal strength occurs, provided that there are no anomalies in the pipeline wrapping causing current to leak. If this correction were not provided, variations in depth would give false indications of such current leakage. The output of amplifier 17 is applied to display means, such as a moving needle indicator 18. If the current intensity shows a sudden variation as the coils are traversed along the pipeline, then it can be assumed that there is a wrapping fault.

Figure 2:
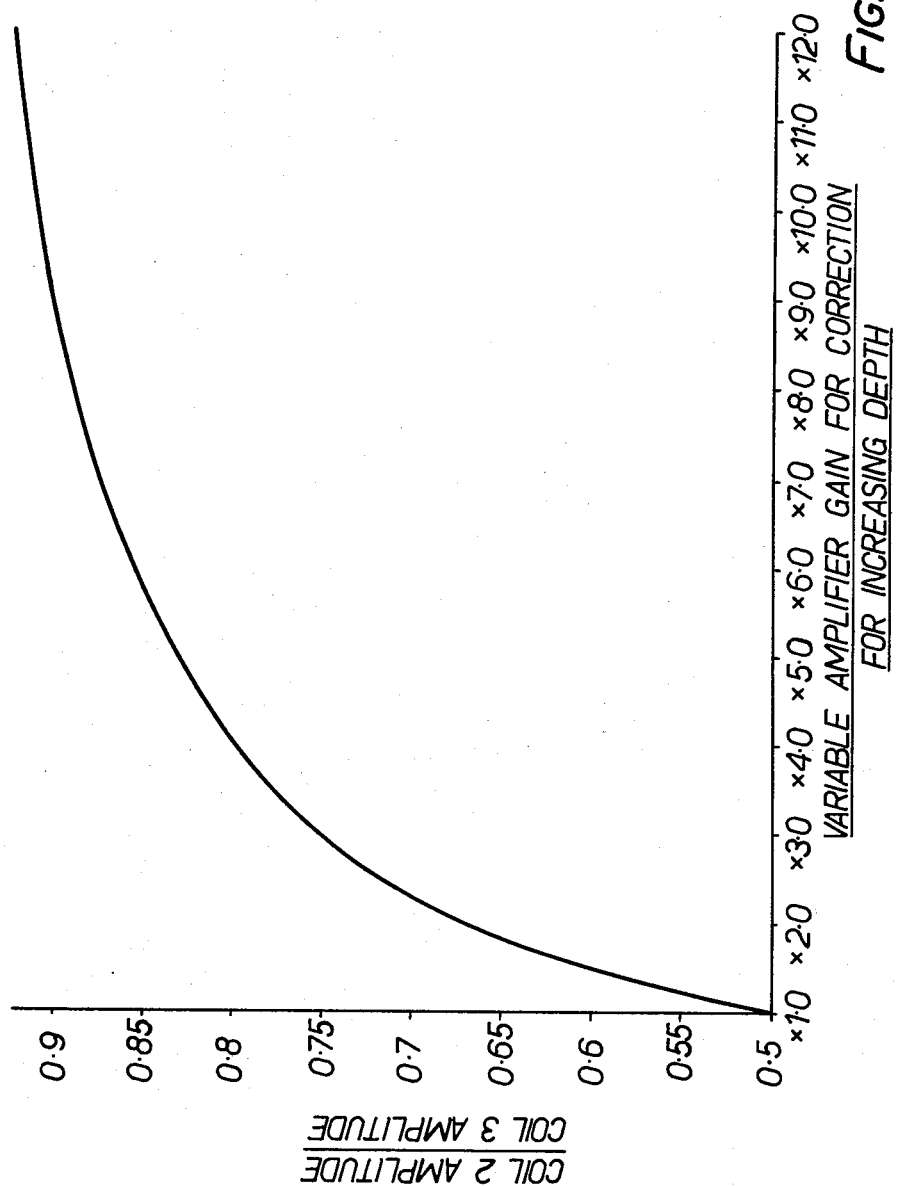
FIG. 2 is a graph associated with part of the circuit of FIG. 1.

The graph of FIG. 2 shows the correction factor slope for depths below coil 3 from 0.5 m to 4.5 m. The slope can be extended for greater depths, if desired.

In addition to the automatic gain control provided by computer 16, there may also be manual gain control indicated by input 20. This can be adjusted so that different generator input levels can be set to convenient meter readings on the indicator 18.

It may be required to provide an indication of absolute pipeline current intensity. In this case a 'calibrate' facility is incorporated, whereby the manual gain control is disconnected and a fixed gain level is substituted. This fixed gain level would be established empirically for given pipe-current levels and the meter sealed accordingly. The only other variable—that of the depth of the pipe—will still be compensated by the computer 16.

An integrating circuit 21 may be incorporated to monitor the correct current intensity signal from amplifier 17 and to operate alarm 22 if it varies by more than a predetermined amount over a given time. Thus the operator will be alerted to intensity changes as he walks the line. Generally, a survey will be carried out by an initial traverse along the line, and any non-linear point in the response can be noted and the position returned to later for more thorough investigation, first with the same instrument. An initial survey can indicate the relative extent of wrapping faults, and thus indicate priorities for subsequent repair.

The profile of a survey can be plotted or recorded, at two meter intervals say, and this gives a great advantage in carrying out subsequent surveys. In these, readings need only be taken at widely spaced intervals, say every mile, and if there is no change from the previous ones then that mile section cannot have developed any faults. Thus a complete re-check can be carried out very quickly.

Survey records can also provide over the years a useful indication of how effective various different wrappings are.

As well as detecting faults in anti-corrosion wrappings of metallic pipelines, the apparatus can also be used to trace faults in electrical cables. The techniques adopted have to be varied according to the type of cable.

For example, with a single phase service cable which has developed a fault, the generator is coupled between the phase core and earth at the installation where the fault has been noticed. The cable is then tracked away from that installation towards the normal source until a sharp drop in the meter reading occurs, revealing the fault.

For a three-phase supply the fault might be open circuit on one or more phases, or a phase-to-phase fault. In the first case, this is usually identified when one or more installations are without supply, while others are still working. The failed installation nearest the source is selected and the signal generator is connected to the faulty phase there. The cable is then tracked back towards the source. The signal level will alter at service connections on other phases and also at faults. To distinguish between the two, whenever there is a signal reduction that position should be tracked around at about 2 meters radius to detect any service or branch cables. If one is found, then the main cable is tracked further. If this fails to reveal a fault clearly, then the faulty phase can be cut where it is known to be live and the tests repeated.

With phase-to-phase faults, if they are severe then when one phase is live another will be at the same phase voltage. Here, the cable should be isolated from the source and the signal is injected into the faulted phases at maximum strength. The cable is then tracked and initially the response will be a rising and falling signal due to the phase cores twisting within the cable. When this rise and fall stops, usually accompanied by an increase in signal, the fault has been located.

I claim:

1. Apparatus for surveying an underground pipeline or other elongated element which carries, or can be made to carry, AC, the pipeline or element then forming a conductor around which there is a substantially cylindrical electromagnetic field, the apparatus comprising a coil array including a first pair of axially parallel coils arrangeable, in use, one above the other with their axes horizontal and transverse to the conductor; a phase comparator and indicator circuit for distinguishing from the outputs of a selection of coils of said array (such outputs being related to their position and attitude and the electromagnetic field) on which side of the conductor the array lies, a depth correction circuit including means responsive to the combined output of the first pair of coils to provide a correction factor dependent on the depth of the conductor, and a variable gain amplifier whose inputs are the correction factor and the output of one of said first pair of coils, and whose output is that coil output modified by the correction factor in such manner that variations in depth alone of the conductor leaves said output substantially unaffected although it will change according to variations of the electromagnetic field, a discontinuity in that field as the apparatus is progressed along the element corresponding to a fault; and indicator or recording means responsive to said variable gain amplifier output by which any such discontinuities can be determined.

2. Apparatus as claimed in claim 1, wherein the coil array includes a second pair of spaced coils with axes transverse to and generally co-planar with those of the first pair, and which in use have their axes generally vertical.

3. Apparatus as claimed in claim 2, wherein the phase comparator is arranged to compare the phases of said second pair of coils to determine whether the coil array is registered with said conductor.

4. Apparatus as claimed in claim 2, wherein the phase comparator is arranged to compare the phases of one of the first pair of coils and one of the second pair to determine on which side of the conductor the coil array lies.

5. Apparatus as claimed in claim 4, wherein the phase comparator is adapted to act as a gate to pass to the associated indicator one or other of the signals from said second pair of coils, depending on the phase relationship between said one coils of the first and second pairs.

6. Apparatus as claimed in claim 1, wherein the indicator associated with the phase comparator is of the moving needle type, the needle being centred when the coil array is directly over the conductor.

7. Apparatus as claimed in claim 1, wherein the phase comparator and indicator circuit further includes audible warning means arranged to operate when the coil array strays from registry with the conductor.

8. Apparatus as claimed in claim 1, wherein said indicator or recording means includes a moving needle indicator.

9. Apparatus as claimed in claim 1, wherein integrating means are provided for the variable gain amplifier output, and an alarm is arranged to respond to variations greater than a predetermined amount in the integrated output.

10. A method of surveying an underground pipeline or other element which carries, or is made to carry, AC, the pipeline or element then forming a conductor around which there is a substantially cylindrical electromagnetic field, the method comprising the steps of:
    (a) traversing a coil array across the line of a suspected conductor,
    (b) comparing the phases of signals induced in a selection of coils to determine on which side of the conductor the array lies,
    (c) locating the array over the conductor,
    (d) deriving from the combined output of two axially parallel coils of the array, one above the other with their axes horizontal and transverse to the conductor, a signal directly related to the depth of the conductor,
    (e) employing this depth signal to modify an output of one of said two axially parallel coils in such manner that variations in depth alone of the conductor leaves said output substantially unaffected, although it will change according to variations of the electromagnetic field, a discontinuity in that field as the coils are progressed along the conductor corresponding to a fault,
    (f) indicating or recording the modified output, and
    (g) repeating steps (a) to (f) along the conductor.

11. A method as claimed in claim 10, wherein the modified output is recorded and wherein for a repeat survey step (g) is taken at more widely spaced points than for the first survey, a comparison being made between the first and repeat survey results at those points.

* * * * *